(12) United States Patent
Regner et al.

(10) Patent No.: US 9,091,726 B1
(45) Date of Patent: Jul. 28, 2015

(54) METHOD AND APPARATUS FOR PERFORMING SELF-TESTING WITHIN AN IC DEVICE

(71) Applicants: Markus Regner, Graefelfing (DE); Heiko Ahrens, Munich (DE); Vladimir Vorisek, Forstinning (DE)

(72) Inventors: Markus Regner, Graefelfing (DE); Heiko Ahrens, Munich (DE); Vladimir Vorisek, Forstinning (DE)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/187,490

(22) Filed: Feb. 24, 2014

(51) Int. Cl.
  *G01R 31/28* (2006.01)
  *G01R 31/3177* (2006.01)
  *G01R 31/317* (2006.01)

(52) U.S. Cl.
  CPC ...... *G01R 31/3177* (2013.01); *G01R 31/31727* (2013.01)

(58) Field of Classification Search
  CPC ............... G01R 31/318575; G01R 31/31721; G01R 31/30; G01R 31/31715; G01R 31/3177; G01R 31/31858; G01R 31/3187; G11C 29/12; G11C 29/44; G11C 29/42; G11C 13/0002; G11C 11/16; G11C 29/14; G11C 29/1201; G11C 29/12015; G11C 29/48; G11C 2029/0401; G06F 11/00; G06F 21/00; G06F 15/7821
  See application file for complete search history.

(56) References Cited

U.S. PATENT DOCUMENTS

| | | |
|---|---|---|
| 5,784,599 A | 7/1998 | Elkhoury |
| 2006/0174178 A1 | 8/2006 | Kiryu |
| 2007/0089004 A1 | 4/2007 | Gloekler et al. |
| 2008/0097739 A1 | 4/2008 | Gloekler et al. |

FOREIGN PATENT DOCUMENTS

KR  100865406 B1  10/2008

OTHER PUBLICATIONS

Liu, C. et al., "Power-Aware Test Scheduling in Network-on-Chip Using Variable-Rate On-Chip Clocking," Proceedings of the 23rd IEEE VLSI Test Symposium, 2005; May 1-5, 2005; ISSN: 1093-0167, pp. 349-354.

Liu, C. et al., "Test Scheduling with Thermal Optimization for Network-on-Chip Systems Using Variable-Rate On-Chip Clocking," Design, Automation and Test in Europe, 2006. DATE '06. Proceedings (vol. 1 ); Mar. 6-10, 2006; USBN: 3-9810801-1-4; 6 pages.

(Continued)

*Primary Examiner* — Guerrier Merant

(57) ABSTRACT

An integrated circuit (IC) device, and method therefor, the IC device comprising a plurality of self-test components arranged to execute self-tests in parallel during a self-test execution phase of the IC device, and at least one clock control component arranged to provide at least one clock signal to the plurality of self-test components at least during the self-test execution phase of the IC device. The at least one clock control component is further arranged to receive at least one indication that self-testing has ceased within at least a first self-test component, and dynamically modulate the at least one clock signal provided to at least one further self-test component for which self-testing has not ceased to increase a clock rate of the at least one clock signal upon receipt of an indication that self-test execution has ceased within the at least first self-test component.

10 Claims, 10 Drawing Sheets

(56) References Cited

OTHER PUBLICATIONS

Salamy, H. et al., "An Effective Solution to Thermal-Aware Test Scheduling on Network-on-Chip Using Multiple Clock Rates," 2012 IEEE 55th International Midwest Symposium on Circuits and Systems (MWSCAS); Aug. 5-8, 2012; ISSN: 1548-3746; pp. 530-533.
Sheshadri, V. et al., "Optimal Power-Constrained SoC Test Schedules with Customizable Clock Rates," 2012 IEEE International SOC Conference (SOCC); Sep. 12-14, 2012; ISSN: 2164-1676; pp. 271-276.

ion time for self-tests, thereby reducing the duration for which application functionality is unavailable.

METHOD AND APPARATUS FOR PERFORMING SELF-TESTING WITHIN AN IC DEVICE

FIELD OF THE INVENTION

This invention relates to a method and apparatus for performing self-testing within an integrated circuit (IC) device.

BACKGROUND OF THE INVENTION

In many integrated circuit (IC) applications, and in particular in safety critical applications, self-testing is an essential component of an IC device, whereby one or more self-tests are executed within at least a part of the IC device. During self-test execution, the application functionality of the part of the device executing the self-test(s) is unavailable for normal (application) operation. However, for safety critical applications the availability of application functionality is critical. Thus, a key limiting factor for self-test execution is execution time so that the amount of time application functionality is unavailable during self-test execution is minimized. In order to minimize self-test execution time, the (or each) clock signal for the part of the device executing the self-test(s) may be optimised for maximum execution speed.

Another limiting factor for self-test execution is power consumption, whereby the power consumption of (at least the part of) the device executing the self-test(s) must remain within a predefined power budget during self-test execution. In order to remain within a predefined power budget during self-test execution, the (or each) clock signal for the part of the device under test may need to be configured to comprise a slower clock speed to reduce the power consumption thereof. However, reducing the speed of the clock signal(s) in this manner during self-test execution will increase the self-test execution time, and thus the amount of time the application functionality is unavailable.

SUMMARY OF THE INVENTION

The present invention provides an integrated circuit device and method of performing self-testing within an integrated circuit device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
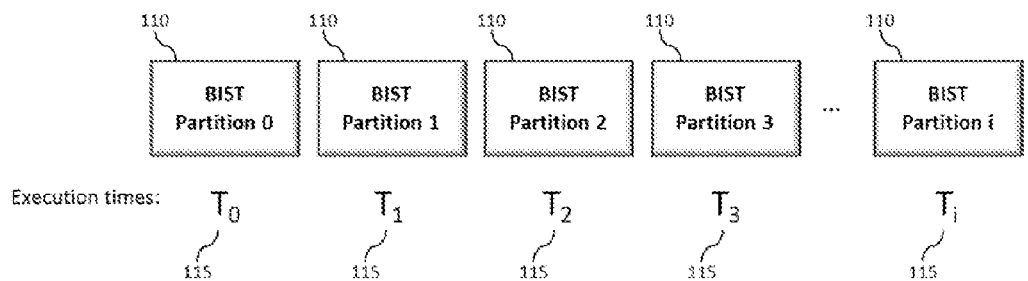
FIG. 1 illustrates a simplified representation of self-test partitions for an integrated circuit device.

Examples of the present invention will now be described with reference to the accompanying drawings. However, it will be appreciated that the present invention is not limited to the specific examples herein described and illustrated in the accompanying drawings. In particular, examples of the present invention are herein described with reference to a method of performing self-testing within a System-on-Chip (SoC) device. However, the present invention is not limited to being implemented within SoC devices, and may equally be implemented within alternative forms of integrated circuit (IC) devices comprising built-in self-test functionality.

Furthermore, because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

In accordance with some examples of a first aspect of the present invention there is provided an integrated circuit (IC) device comprising a plurality of self-test components arranged to execute self-tests in parallel during a self-test execution phase of the IC device, and at least one clock control component arranged to provide at least one clock signal to the plurality of self-test components at least during the self-test execution phase of the IC device. The at least one clock control component is further arranged to receive at least one indication that self-testing has ceased within at least a first self-test component, and dynamically modulate the at least one clock signal provided to at least one further self-test component during the self-test execution phase to increase a clock rate of the at least one clock signal upon receipt of an indication that self-testing has ceased within the at least first self-test component.

In this manner, and as described in greater detail below, spare power budget capacity may be utilised to reduce execution time for self-tests, and thus to reduce the overall execution time for the execution of self-tests within an IC device as a whole.

In some optional embodiments, the at least one clock control component may be arranged to increase the clock rate of the at least one clock signal provided to the self-test components by a constant factor each time an indication self-testing has ceased within one of the plurality of self-test components is received.

In some optional embodiments, the at least one clock control component may be arranged to determine a number, i, of active self-test components executing self-tests based at least partly on the at least one received indication that self-testing has ceased within at least one of the plurality of self-test components, and to dynamically modulate the at least one clock signal based at least partly on the determined number i of active self-test components.

In some optional embodiments, the at least one clock control component may be arranged to receive at least one seed clock signal and to modulate the at least one seed clock signal to generate the at least one clock signal provided to the self-test components based at least partly on the determined number i of active self-test components.

In some optional embodiments, the at least one clock control component may be arranged to receive a plurality of seed clock signals, and generate the at least one clock signal provided to the self-test components based at least partly on one of the received seed clock signals selected in accordance with the determined number i of active self-test components.

In some optional embodiments, the at least one clock control component may be arranged to receive a plurality of modulation factor values, and generate the at least one clock signal provided to the self-test components based at least partly on at least one of the received modulation factor values selected in accordance with the determined number i of active self-test components.

In some optional embodiments, the at least one clock control component may be arranged to receive at least one seed clock signal and to modulate the at least one seed clock signal in accordance with at least one of the received modulation factor values selected in accordance with the determined number i of active self-test components.

In some optional embodiments, the at least one clock control component may be arranged to identify at least one of:
  active self-test components executing self-tests; and
  inactive self-test components for which self-testing has ceased,
based at least partly on the at least one received indication that self-testing has ceased within at least one of the plurality of self-test components, and to dynamically modulate the at least one clock signal based at least partly on the identified active/inactive self-test components.

In some optional embodiments, the at least one clock control component may be arranged to receive a plurality of modulation factor values, and to generate the at least one clock signal provided to the self-test components based at least partly on at least one of the received modulation factor values selected in accordance with the identified active/inactive self-test components.

In accordance with some examples of a second aspect of the present invention there is provided a method of performing self-testing within an IC device comprising a plurality of self-test components arranged to execute self-tests in parallel during a self-test execution phase of the IC device. The method comprises, within the IC device during a self-test execution phase, receiving at least one indication that self-testing has ceased within at least a first self-test component of the IC device, and dynamically modulating at least one clock signal provided to at least one further self-test component of the IC device during the self-test execution phase to increase a clock rate of the at least one clock signal upon receipt of the at least one indication that self-testing has ceased within the at least first self-test component of the IC device.

Self-testing within an integrated circuit (IC) device, for example such as a System on Chip (SoC) device or the like, is typically implemented using one or more forms of built-in self-test (BIST) mechanism(s). A Logic built-in self-test (or LBIST) is one form of BIST mechanism in which hardware is provided within an IC device allowing the IC device to test its own operation, as opposed to reliance on external automated test equipment. Typically an LBIST is driven by an LBIST-controller running with a clearly defined operating frequency. Other forms of BIST include, by way of example only, MBIST (a BIST optimized for testing internal memory) and software based BIST. Typically an MBIST is driven by an MBIST-controller running with a clearly defined operating frequency. For software based BIST, software is executed by processors which run at a clearly identifiable operating frequency.

In order to get a fine-granular BIST result over specific areas in an SoC, it is known for the SoC and its self-tests to be separated into discrete areas, or 'partitions'. FIG. 1 illustrates a simplified representation of such LBIST partitions for an integrated circuit device such as an SoC. In the example illustrated in FIG. 1, the SoC (not explicitly shown) has been arranged into i+1 partitions 110, with each partition 110 relating to a distinct area of the SoC. These partitions 110 traverse through (functionally) separate self-tests in order to receive information about the operational integrity of the distinct SoC areas. Each partition is arranged to execute one or more self-tests, with the execution times T required for executing the respective self-test(s) typically differing for each partition, as indicated at 115. Each self-test is designed to 'exercise' the relevant SoC area in a particular manner such that the combination of tests provides comprehensive test coverage of the relevant SoC area.

Different partitions typically require different execution times/cycles for their respective self-tests. In terms of availability of an SoC device, it is important that a self-test executes and finishes in as short a time as possible. Accordingly, self-tests of several (or even all) partitions are often executed in parallel. A limiting factor for self-test execution is power consumption, whereby the power consumption of (at least the part of) the device executing self-tests must remain within a predefined power budget during self-test execution.

Figure 2:
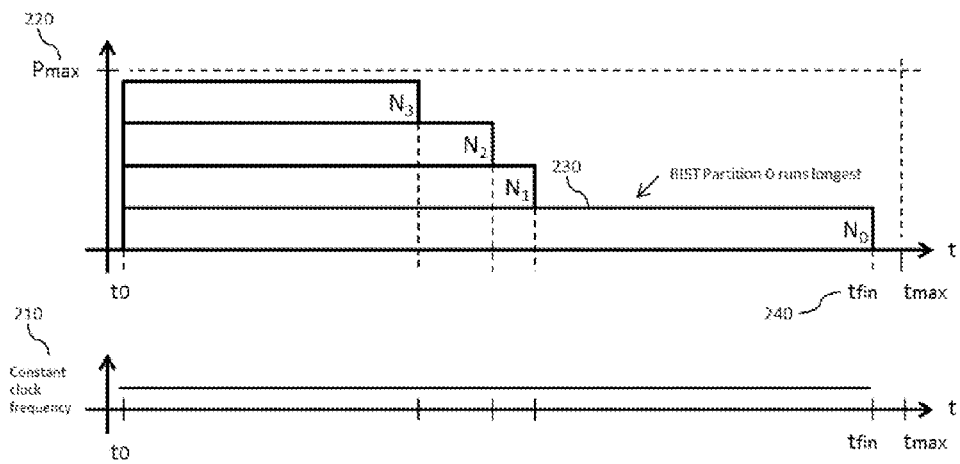
FIG. 2 illustrates a simplified graph of power consumption versus execution time for the conventional execution of self-tests in parallel within a plurality of partitions.

FIG. 2 illustrates a simplified graph of an example of power consumption versus execution time for the execution of self-tests in parallel within a plurality of partitions. In order to minimise the total execution time 240, a clock frequency 210 for the partitions may be optimised such that the combined power consumption of all the partitions executing self-tests within a particular self-test execution phase is as close as feasible to a predefined power budget, indicated at $P_{max}$ 220 in FIG. 2. Thus, the total execution time 240 for the execution of self-tests is defined by optimised clock frequency 210 and the resulting run time for the 'longest' partition self-test execution, which in the illustrated example is the resulting run time for partition 0, indicated generally at 230.

The inventors of the present invention have recognised that when self-testing ceases within one of the partitions, a part of the power budget capacity formerly used for self-testing within that partition is freed up. As such, spare power budget capacity becomes available when self-testing ceases within one of the partitions ceases; the amount of spare power budget capacity available increasing each time self-testing ceases within a partition. Furthermore, the inventors have recognised that this spare power budget capacity may be utilised to reduce execution time for self-tests still executing within other partitions, and thus to reduce the overall execution time for the execution of self-tests within the SoC device as a whole.

Figure 3:
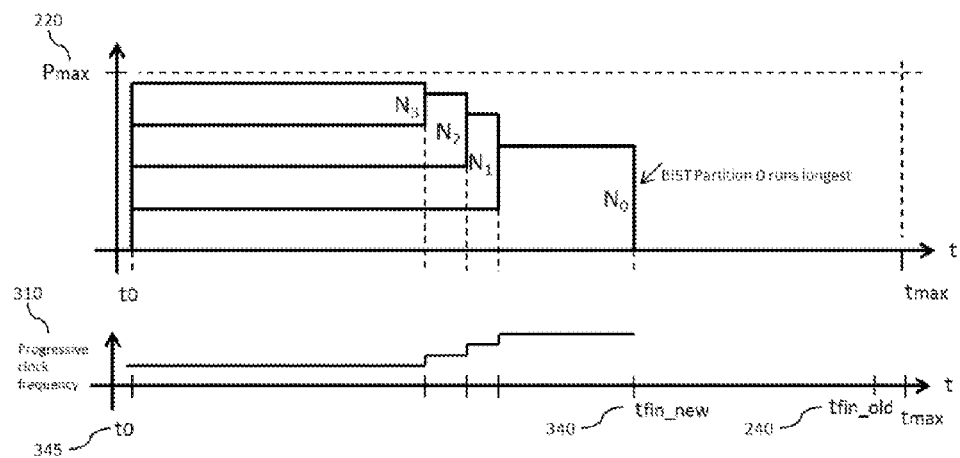
FIG. 3 illustrates a simplified graph of an example of power consumption versus execution time for the execution of self-tests in parallel within a plurality of partitions.

FIG. 3 illustrates a simplified graph of an alternative example of power consumption versus execution time for the execution of self-tests in parallel within a plurality of partitions. In the example illustrated in FIG. 3 a clock signal 310 for the partitions is dynamically modulated during the execution of self-tests to progressively increase the clock rate when self-testing ceases within one of the partitions. In this manner, at least some of the spare power budget that becomes available when self-testing ceases within one of the partitions may be utilised to increase the self-test execution speed for the remaining partitions. As a result, the execution time for the remaining partitions may be reduced as compared with the example illustrated in FIG. 2. Significantly, the overall execution run time 340 when such a progressive clock rate is implemented may be reduced compared with the overall execution run time 240 when a constant clock rate is implemented as in the example of FIG. 2. In the example illustrated in FIG. 3, the clock frequency is increased each time self-testing ceases within one of the partitions. However, it will be appreciated that a reduction in the overall run time may be achieved by even just a single increase of the clock frequency after self-testing has ceased within one or more of the partitions.

Figure 4:
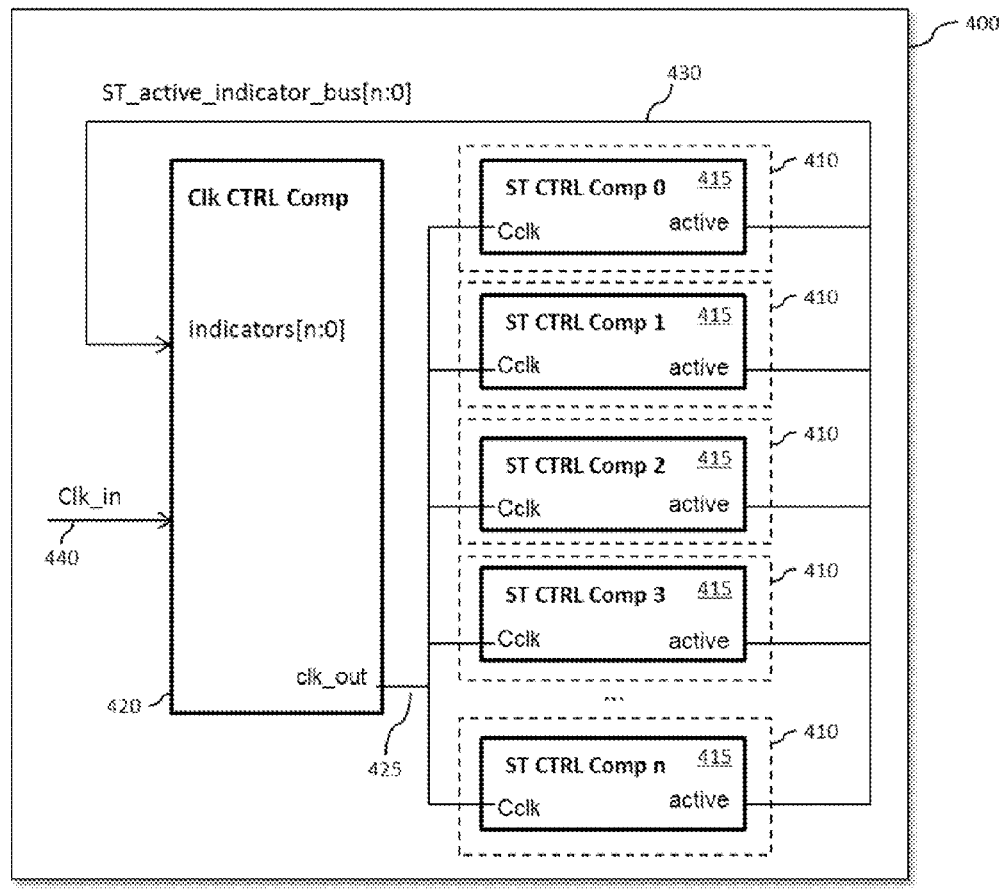
FIG. 4 illustrates a simplified block diagram of an example of an IC device comprising built-in self-test functionality.

Referring now to FIG. 4, there is illustrated a simplified block diagram of an example of an IC device 400, such as an SoC device, comprising built-in self-test functionality. The IC device 400 comprises n+1 self-test components 410 arranged to execute self-tests in parallel during a self-test execution phase of the IC device 400. The self-test components 410 may comprise any appropriate form of BIST component. For example, the self-test components 410 may comprise LBIST components arranged to execute LBIST self-test patterns within respective partitions of the IC device 400. Additionally/alternatively, the self-test components 410 may comprise MBIST components arranged to execute internal memory self-tests and/or software based BIST components. In the illustrated example, each self-test component 410 comprising at least one control component 415 arranged to control the execution of self-tests within the respective partition.

The IC device 400 further comprises a clock control component 420 arranged to provide a clock signal 425 to the self-test components 410 at least during a self-test execution phase of the IC device 400. In the context of the present invention, a self-test execution phase comprises (at least) a phase of operation of at least a part of the IC device 400 wherein at least one of the self-test components 410 is actively executing at least one self-test. For example, referring back to FIG. 3 the self-test execution phase may be considered to start at $t_0$ 345 and end upon reaching the overall execution run time 340 when execution of the last of the self-tests ceases.

In the example illustrated in FIG. 4, the clock control component 420 is further arranged to receive an indication 430 that self-testing has ceased (for example when execution of the respective self-test(s) has finished) within each of the self-test components 410, and to dynamically modulate the clock signal 425 provided to the self-test components 410 during the self-test execution phase to increase a clock rate of the clock signal 425 upon receipt of an indication that self-testing has ceased within one of the self-test components 410.

In the illustrated example, the control component 415 of each self-test component 410 is arranged to output an 'active' indication (e.g. when asserted) to indicate when the respective self-test component 410 is actively executing a self-test and to output an 'inactive' indication (e.g. when not asserted) to indicate when the respective self-test component 410 is not (e.g. has ceased) executing a self-test. The clock control component 420 may then create a correlation between the received indications 430 of the active/inactive states of the self-test components 410 and the clock signal 425 provided to the self-test components 410 during a self-test execution phase of the IC device 400. For example, with a decreasing number of simultaneously active self-test components 410, an increasing clock rate may be configured for the clock signal 425 provided to the self-test components 410. Thus, in some examples the clock control component 420 may be arranged to increase the clock rate of the clock signal 425 provided to the self-test components 410 by a constant factor each time an indication 430 that self-testing has ceased within one of the self-test components (e.g. a change from an active state to an inactive state) is received.

Figure 5:
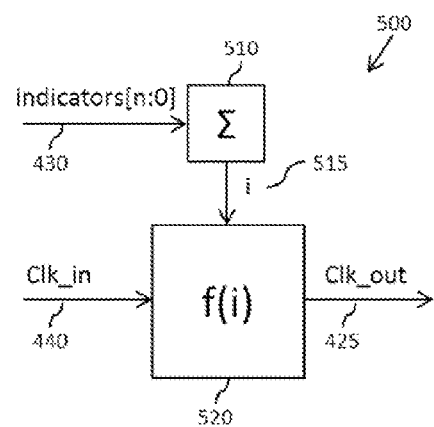
FIG. 5 illustrates a simplified block diagram of an example of a part of a clock control component of the IC device of FIG. 4.

FIG. 5 illustrates a simplified block diagram of an example of a part 500 of the clock control component 420 of FIG. 4 arranged to control the clock rate of the clock signal 425 provided to the self-test components 410. In the example illustrated in FIG. 5, the part 500 of the clock control component 420 comprises a summing component 510 arranged to receive the active/inactive state indications 430 output by the control components 415 of the self-test components 410 and to output a sum i 515 of the number of active (or inactive) self-test components 410 executing self-tests based on the received active/inactive state indications 430. The part 500 of the clock control component 420 further comprises a clock modulation component 520 arranged to receive a seed clock signal 440 and the determined number i 515 of (in)active self-test components 410, and to modulate the received clock signal 440 to generate the clock signal 425 provided to the self-test components 410 based on the determined number i 515 of (in)active self-test components 410.

In this manner, the clock control component 420 may be arranged to determine a number, i, of (in)active self-test components 410 executing self-tests based on the received active/inactive state indications 430, and dynamically modulate the clock signal 425 provided to the self-test components 410 based at least partly on the determined number i of (in)active self-test components.

For example, the modulation component 520 may be arranged to generate as the clock signal 425 provided to the self-test components 410 a signal based on Equation 1 below:

$$clk_{out} = clk_{in} * const * i \qquad \text{[Equation 1]}$$

where const represents, say, a constant non-zero modulation factor between the seed clock signal clk_in 440 and the clock signal clk_out 425 provided to the self-test components 410. In this manner, the frequency of the clock signal 425 provided to the self-test components 410 increases (by a constant factor clk_in*const) every time self-testing ceases within one of the self-test components 410.

Figure 6:
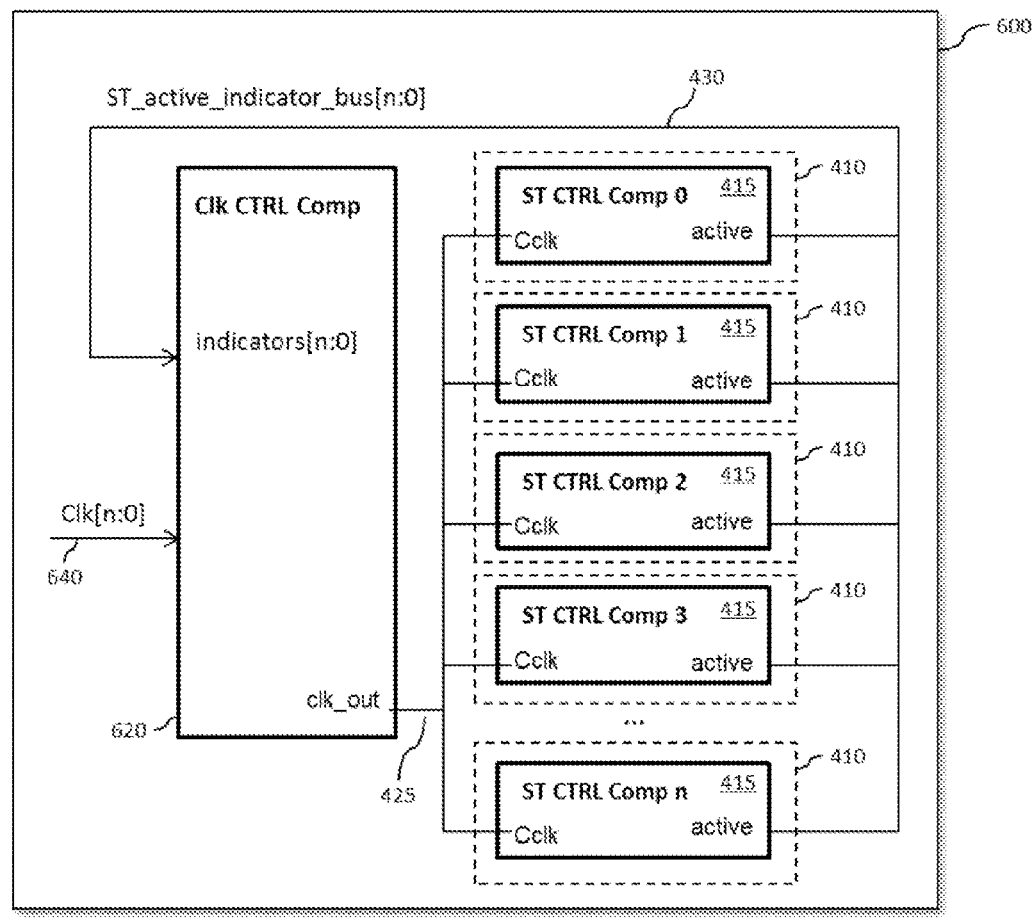
FIG. 6 illustrates a simplified block diagram of an alternative example of an IC device comprising built-in self-test functionality.

Referring now to FIG. 6, there is illustrated a simplified block diagram of an alternative example of an IC device 600 comprising built-in self-test functionality. The IC device 600 of FIG. 6 also comprises n+1 self-test components 410 arranged to execute self-tests in parallel during a self-test execution phase of the IC device 600. The IC device 600 further comprises a clock control component 620 arranged to provide a clock signal 425 to the self-test components 410 at least during a self-test execution phase of the IC device 600.

The clock control component 620 is arranged to receive an indication that self-testing has ceased within each of the self-test components 410, which in the illustrated example comprises receiving active/inactive state indications 430 from control components 415 of the respective self-test components 410.

Figure 7:
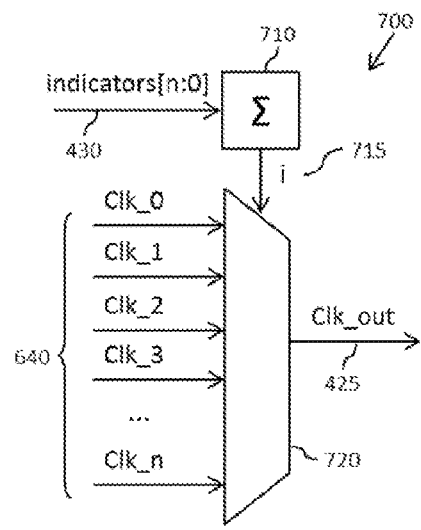
FIG. 7 illustrates a simplified block diagram of an example of a part of a clock control component of the IC device of FIG. 6.

In the example illustrated in FIG. 6, the clock control component 620 is arranged to receive a plurality of seed clock signals 640 and to generate the clock signal 425 provided to the self-test components 410 based on one of the received seed clock signals 640. For example, FIG. 7 illustrates a simplified block diagram of an example of a part 700 of the clock control component 620 of FIG. 6 arranged to control the clock rate of the clock signal 425 provided to the self-test components 410. In the example illustrated in FIG. 7, the part 700 of the clock control component 620 comprises a summing component 710 arranged to receive the active/inactive state indications 430 output by the control components 415 of the self-test components 410 and to output a sum i 715 of the number of active (or inactive) self-test components 410 executing self-tests based on the received active/inactive state indications 430. The part 700 of the clock control component 620 further comprises a clock selection component 720, which in the illustrated example comprises a multiplexer, arranged to receive the plurality of seed clock signals 640 and to selectively output one of the received seed clock signals 640 as the clock signal 425 provided to the self-test component 410 in accordance with the determined number i 715 of (in)active self-test components 410. Thus, in this manner the clock control component 620 is arranged to generate the clock signal 425 provided to the self-test components 410 based on one of the received seed clock signals 640 selected in accordance with a determined number i of (in)active self-test components. Specifically, by providing clock signals comprising progressively higher frequencies to the clock control component 620, a clock signal with a progressively higher frequency may be selectively output to the self-test components 410 each time an indication is received that execution of self-tests within one of the self-test components 410 has ceased.

Figure 8:
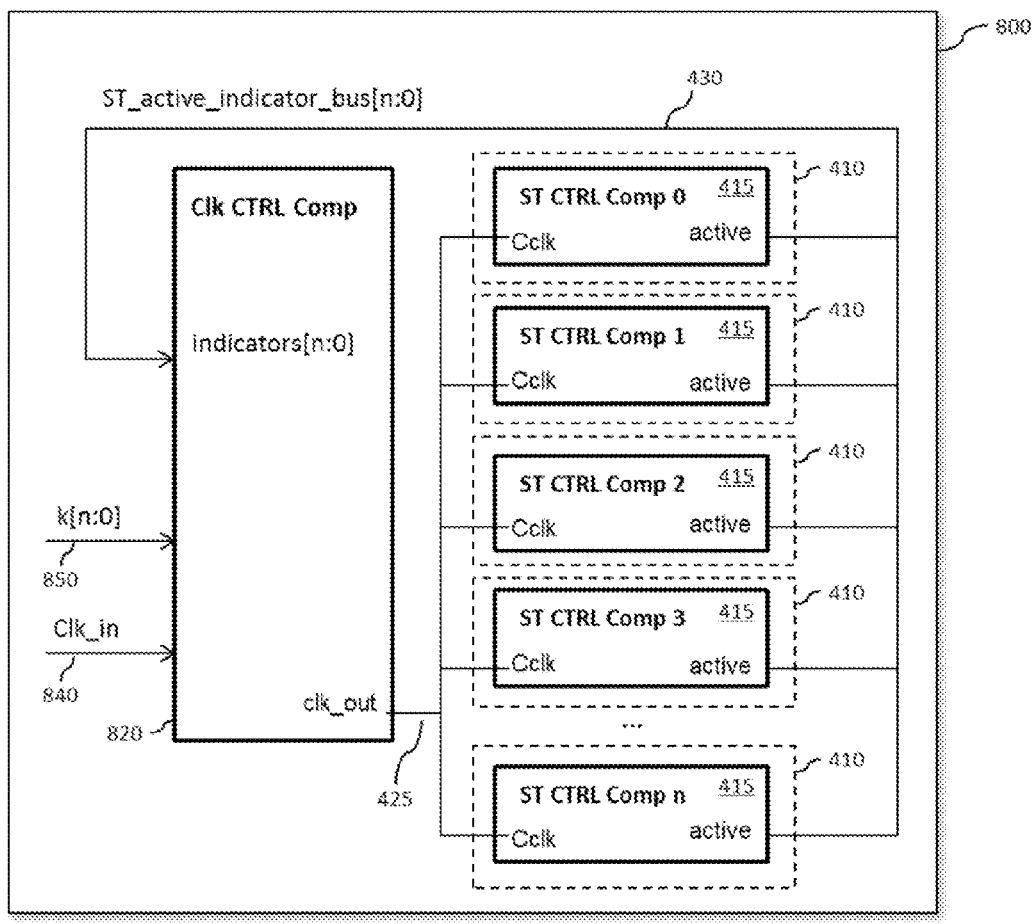
FIG. 8 illustrates a simplified block diagram of a further alternative example of an IC device comprising built-in self-test functionality.

Referring now to FIG. 8, there is illustrated a simplified block diagram of a further alternative example of an IC device 800 comprising built-in self-test functionality. The IC device 800 of FIG. 8 also comprises n+1 self-test components 410 arranged to execute self-tests in parallel during a self-test execution phase of the IC device 800. The IC device 800 further comprises a clock control component 820 arranged to provide a clock signal 425 to the self-test components 410 at least during a self-test execution phase of the IC device 800. The clock control component 820 is arranged to receive an indication that self-testing has ceased within each of the self-test components 410, which in the illustrated example comprises receiving active/inactive state indications 430 from control components 415 of the respective self-test components 410.

Figure 9:
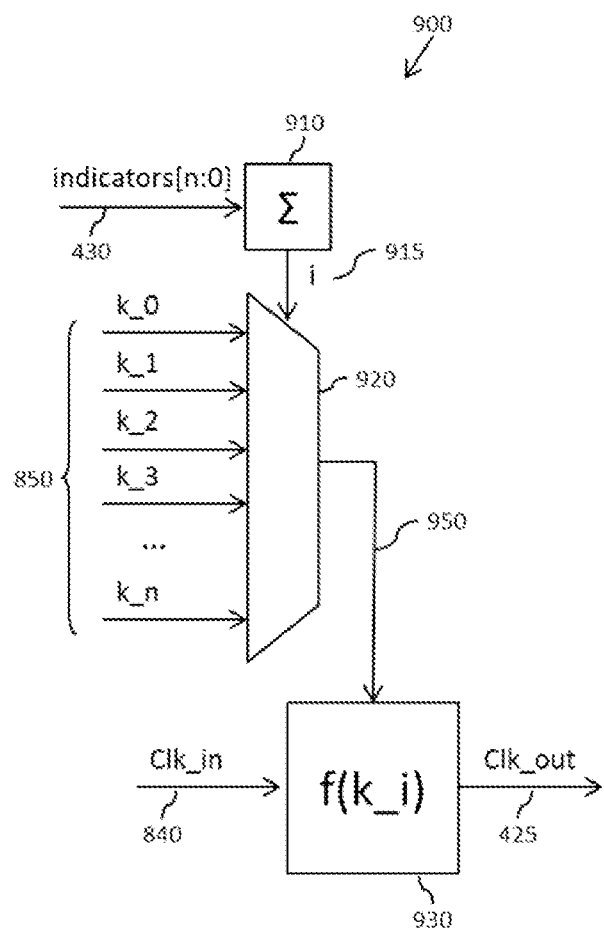
FIG. 9 illustrates a simplified block diagram of an example of a part of a clock control component of the IC device of FIG. 8.

In the example illustrated in FIG. 8, the clock control component 820 is arranged to receive a seed clock signal 840 and a plurality of modulation factor values 850, and to generate the clock signal 425 provided to the self-test components 410 based on the received seed clock signal 840 and at least one of the received modulation factor values 850. For example, FIG. 9 illustrates a simplified block diagram of an example of a part 900 of the clock control component 820 of FIG. 8 arranged to control the clock rate of the clock signal 425 provided to the self-test components 410. In the example illustrated in FIG. 9, the part 900 of the clock control component 820 comprises a summing component 910 arranged to receive the active/inactive state indications 430 output by the control components 415 of the self-test components 410 and to output a sum i 915 of the number of active (or inactive) self-test components 410 executing self-tests based on the received active/inactive state indications 430. The part 900 of the clock control component 820 further comprises a modulation factor selection component 920, which in the illustrated example comprises a multiplexer, arranged to receive the plurality of modulation factor values 850 and to selectively output one of the received modulation factor values 950. The part 900 of the clock control component 420 further comprises a clock modulation component 930 arranged to receive the seed clock signal 840 and the modulation factor value 950 output by the modulation factor selection component 920, and to modulate the received seed clock signal 840 to generate the clock signal 425 provided to the self-test components 410 based on the received modulation factor value 950.

For example, the clock modulation component 930 may be arranged to generate as the clock signal 425 provided to the self-test components 410 a signal based on Equation 2 below:

$$\text{clk}_{out} = \text{clk}_{in} * \text{const} * k\_i \qquad \text{[Equation 2]}$$

where const represents, say, a constant non-zero modulation factor between the seed clock signal clk_in 440 and the clock signal clk_out 425 provided to the self-test components 410, and k_i represents the modulation factor value 950 output by the modulation factor selection component 920. Thus, in this manner the clock control component 820 is arranged to generate the clock signal 425 provided to the self-test components 410 based on at least one of the received modulation factor values selected in accordance with the determined number i of active self-test components. Specifically, by providing progressively higher modulation factor values to the clock control component 820 (for example within one or more programmable registers or the like, which are not illustrated in the accompanying drawings), a clock signal with a progressively higher frequency may be generated and output to the self-test components 410 each time an indication is received that execution of self-tests within one of the self-test components 410 has ceased.

In some examples it is contemplated that the seed clock signal 840 for the example illustrated in FIGS. 8 and 9 may be selected from a plurality of seed clock signals, in a similar manner to that illustrated in FIGS. 6 and 7.

Figure 10:
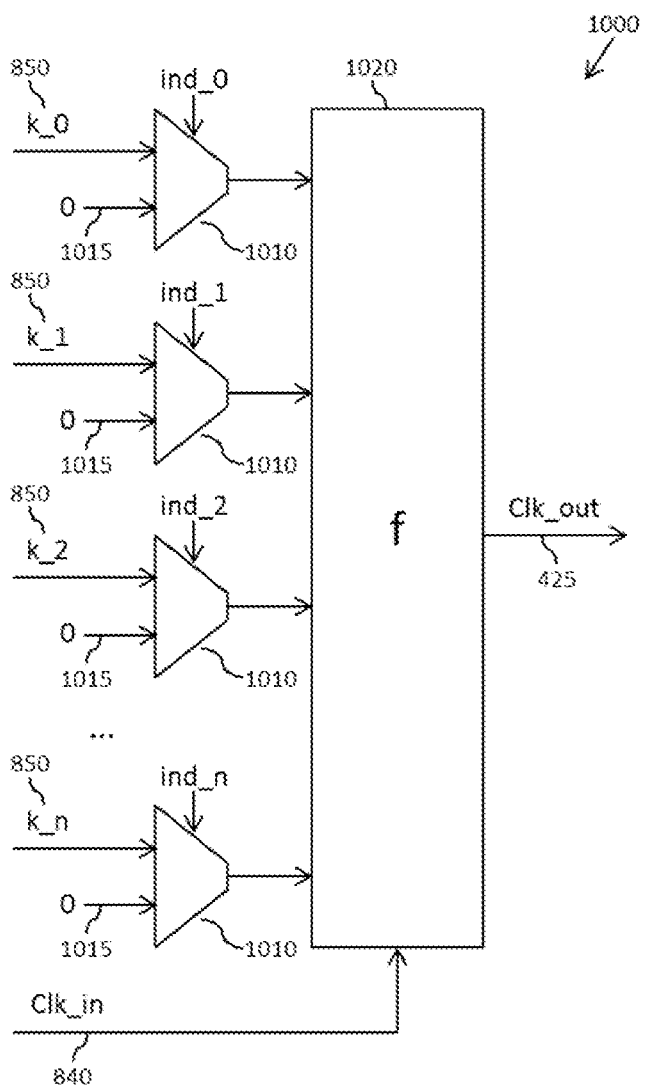
FIG. 10 illustrates a simplified block diagram of an alternative example of a part of the clock control component of the IC device of FIG. 8.

In the various examples illustrated in FIGS. 4 to 9, the clock signal 425 provided to the self-test components 410 has been generated based at least partly on a determined number i 515, 715, 915 of (in)active self-test components 410. In some alternative examples, a clock control component may be arranged to identify active and/or inactive self-test components, and dynamically modulate the clock signal 425 provided to the self-test components 410 based at least partly on the identified active/inactive self-test components. By way of example, FIG. 10 illustrates a simplified block diagram of an alternative example of a part 1000 of the clock control component 820 of FIG. 8 arranged to control the clock rate of the clock signal 425 provided to the self-test components 410. In the example illustrated in FIG. 10, the part 1000 comprises a plurality of multiplexer components 1010, each multiplexer component 1010 arranged to receive at a control input thereof an active/inactive state indication (ind_0 to ind_n) from one of the self-test components 410. Each multiplexer component 1010 is further arranged to receive at a first data input thereof one of the modulation factor values 850, and at a second data input thereof a null value 1015, which in the illustrated example comprises a '0' value. In this manner, each of the multiplexer components 1010 is arranged to output either the respective modulation factor value 850 or the null value 1015 depending on the received active/inactive state indication 430. The part 1000 of the clock control component 820 further comprises a clock modulation component 1020 arranged to receive the seed clock signal 840 and the values output by the multiplexer components 1010 and to modulate the received seed clock signal 840 to generate the clock signal 425 provided to the self-test components 410 based on the received values output by the multiplexer components 1010. For example, the clock modulation component 1020 may be arranged to generate as the clock signal 425 provided to the self-test components 410 a signal based on Equation 3 below:

$$clk_{out} = clk * const * \Sigma val\_i \qquad \text{[Equation 3]}$$

where val_i represents the value output by the $i^{th}$ multiplexer component 1010. In this manner, the clock signal 425 provided to the self-test components 410 may be based not only on the number of 'active' self-test components 410, but also based on which self-test components 410 are active, whereby different modulation factor values 850 may be configured for the different self-test components 410, for example within programmable registers (not shown). In this manner, variations in power consumption between individual self-test components 410 when executing self-tests may be taking into consideration when modulating the clock signal 425.

Figure 11:
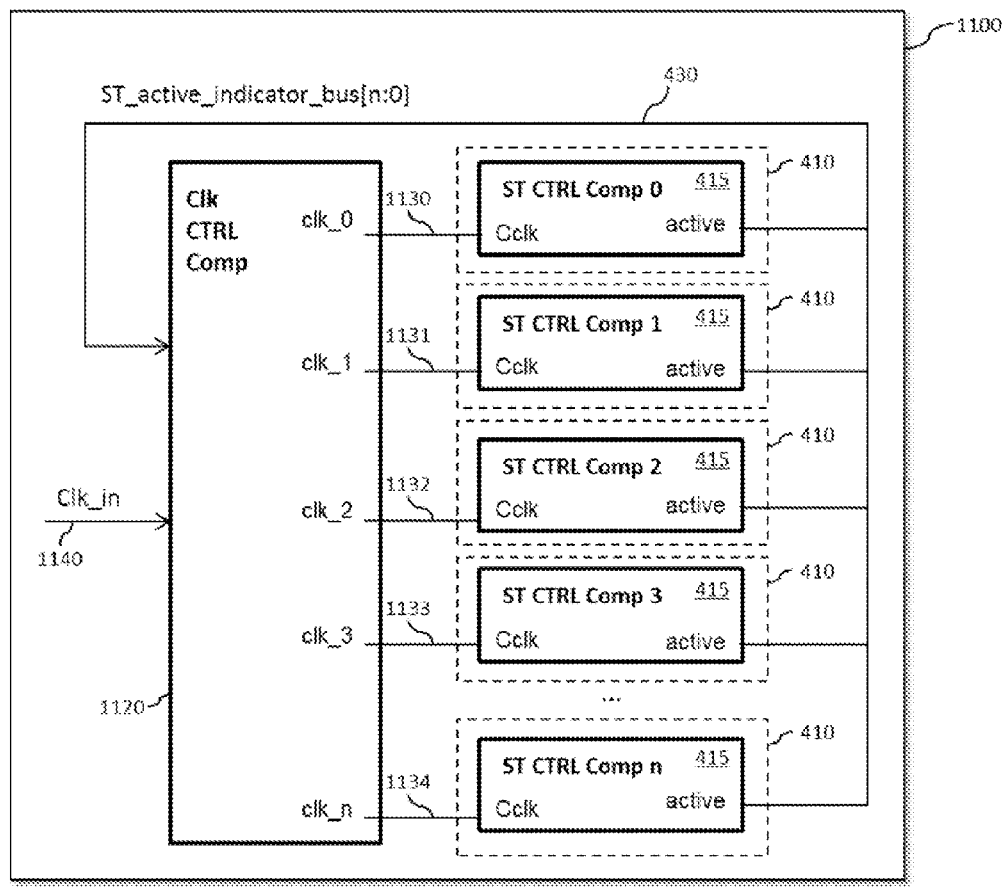
FIG. 11 illustrates a simplified block diagram of a still further alternative example of an IC device comprising built-in self-test functionality.

In the various examples illustrated in FIGS. 4 to 10, a clock control component has been arranged to provide the same common clock signal 425 to all of the self-test components 410. In some alternative examples, a clock control component may be arranged to provide different clock signals to different self-test components. For example, FIG. 11 illustrates a simplified block diagram of a still further alternative example of an IC device 1100 comprising built-in self-test functionality. The IC device 1100 of FIG. 11 also comprises n+1 self-test components 410 arranged to execute self-tests in parallel during a self-test execution phase of the IC device 1100. The IC device 1100 further comprises a clock control component 1120 arranged to provide separate clock signals 1130, 1131, 1132, 1133, 1134 to each of the self-test components 410 at least during a self-test execution phase of the IC device 1100. The clock control component 1120 is arranged to receive an indication that self-testing has ceased within each of the self-test components 410, which in the illustrated example comprises receiving active/inactive state indications 430 from control components 415 of the respective self-test components 410.

Figure 12:
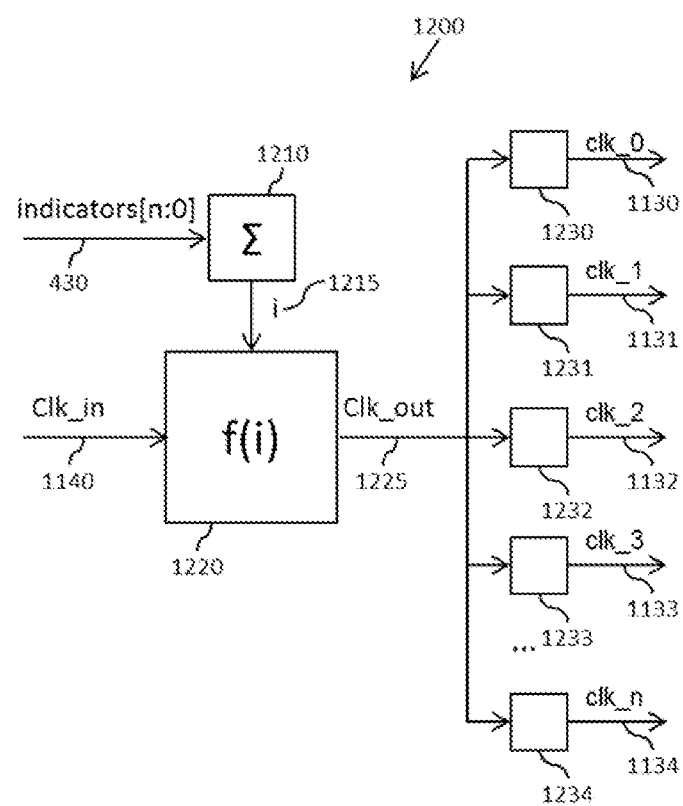
FIG. 12 illustrates a simplified block diagram of an example of a part of a clock control component of the IC device of FIG. 11.

In the example illustrated in FIG. 11, the clock control component 1120 is arranged to receive a seed clock signal 1140 and to modulate the received seed clock signal 1140 to generate the clock signals 1130, 1131, 1132, 1133, 1134 provided to the self-test components 410 based at least partly on the received active/inactive state indications 430. For example, FIG. 12 illustrates a simplified block diagram of an a example of a part 1200 of the clock control component 1120 of FIG. 11 arranged to control the clock rate of the clock signals 1130, 1131, 1132, 1133, 1134 provided to the self-test components 410. In the example illustrated in FIG. 12, the part 1200 of the clock control component 1120 comprises a summing component 1210 arranged to receive the active/inactive state indications 430 output by the control components 415 of the self-test components 410 and to output a sum i 1215 of the number of active (or inactive) self-test components 410 executing self-tests based on the received active/inactive state indications 430. The part 1200 of the clock control component 1120 further comprises a first clock modulation component 1220 arranged to receive the seed clock signal 1140 and the determined number i 1215 of (in) active self-test components 410, and to modulate the received clock signal 1140 to generate an intermediate clock signal 1225 based on the number i 1215 of (in)active self-test components 410. For example, the modulation component 1220 may be arranged to generate as the intermediate clock signal 1225 a signal based on Equation 4 below:

$$clk\_out = clk\_in * const * i \qquad \text{[Equation 4]}$$

where const represents, say, a constant non-zero modulation factor between the seed clock signal clk_in 1140 and the intermediate clock signal clk_out 1225 provided to the self-test components 410. In this manner, the frequency of the intermediate clock signal 1225 may be increased (by a constant factor clk_in*const) every time self-testing ceases within one of the self-test components 410. The intermediate clock signal 1225 may then be provided to each of a set of further clock modulation components 1230, 1231, 1232, 1233, 1234. Each of the set of further clock modulation components 1230, 1231, 1232, 1233, 1234 may then perform a further modulation of the intermediate clock signal 1225 to generate a respective clock signal 1130, 1131, 1132, 1133, 1134 provided to one or more of the self-test components 410.

In some alternative examples, the clock control component 1120 of FIG. 11 may additionally/alternatively be arranged to receive a plurality of seed clock signals and to generate the clock signals 1130, 1131, 1132, 1133, 1134 provided to the self-test components 410 based on one of the received seed clock signals, for example in a similar manner to the clock control component 620 of FIGS. 6 and 7. In some further alternative examples, the clock control component of FIG. 11 may additionally/alternatively be arranged to receive a plurality of modulation factor values, and to generate the clock signals 1130, 1131, 1132, 1133, 1134 provided to the self-test components 410 based on the received seed clock signal and at least one of the received modulation factor values, for example in a similar manner to the clock control component 820 of FIGS. 8 and 9. In some still further alternative examples, the clock control component of FIG. 11 may additionally/alternatively be arranged to identify active and/or inactive self-test components, and dynamically modulate the clock signals 1130, 1131, 1132, 1133, 1134 provided to the self-test components 410 based at least partly on the identified active/inactive self-test components, for example in a similar manner to the example illustrated in FIG. 10.

Figure 13:
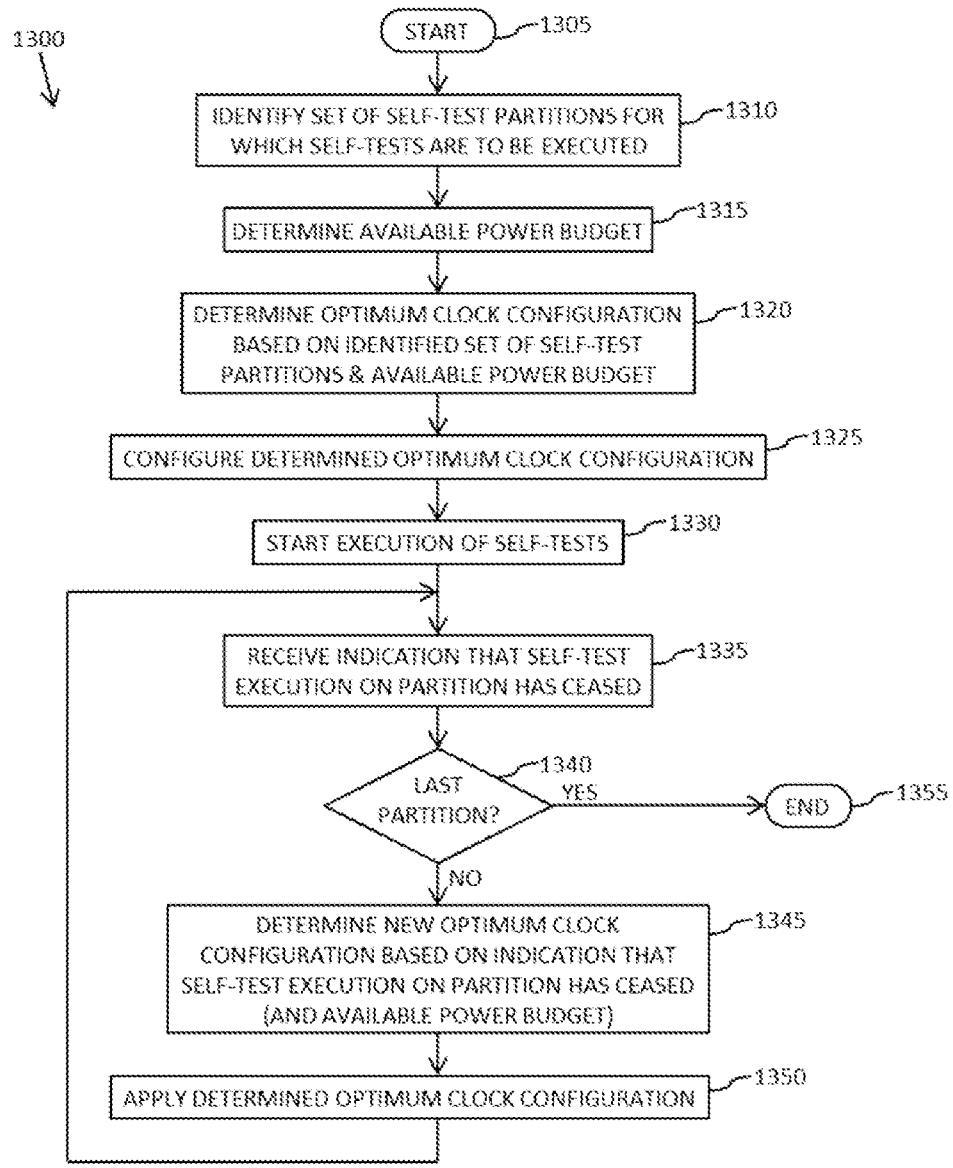
FIG. 13 illustrates a simplified flowchart of an example of a method of performing self-testing within an IC device.

Referring now to FIG. 13, there is illustrated a simplified flowchart 1300 of an example of a method of performing self-testing within an IC device, such as may be implemented within one or more of the IC devices and/or clock control components of FIGS. 4 to 12. The method starts at 1305 and moves on to 1310 where a set of self-test partitions for which self-tests are to be executed is identified. In some examples such a set may simply comprise all self-test partitions within the IC device, where it may be assumed that self-tests will be executed for all self-test partitions within the IC device. Next, at 1315, an available power budget for the execution of self-tests is determined. Such an available power budget may comprise a fixed, predetermined value stored within, say, a programmable register or the like. Alternatively the available power budget may be dynamically determined, for example based on a determination of other functionality running on the IC device at that time. Having determined that available power budget, the method moves on to 1320 where an optimum clock configuration is determined based on the identified set of self-test partitions for which self-tests are to be executed and the determined available power budget. Such an optimum clock configuration may be determined based on one or more of:

a number of self-test components for which self-tests are to be executed (such as hereinbefore described with reference to FIGS. 4 to 9, 11 and 12);

specific identified self-test components for which self-tests are to be executed (such as hereinbefore described with reference to FIG. 10);

one or more seed clock signals;

one or more clock modulation values;

etc.

Determining an optimum clock configuration may comprise determining an optimum clock configuration for a single clock signal to be provided to all self-test components. Alternatively, determining an optimum clock configuration may comprise determining an optimum clock configuration for a plurality of clock signals to be provided to the various self-test components.

Having determined the optimum clock configuration, the method moves on to 1325 where the determined optimum clock configuration is configured. In some examples, steps 1320 and 1325 may be merged into a single step, for example where the optimum clock configuration is performed using combinational logic etc. Next, at 1330 execution of the self-tests is started.

Upon receipt of at least one indication that self-testing has ceased within at least one self-test partition, at 1335, the method moves on to 1340 where it is determined whether the self-test partition for which self-testing has been indicated as having ceased is the last self-test partition within which self-tests were being executed. If it is determined that it is not the last self-test partition, the method moves on to 1345 where a new optimum clock configuration for the self-test components executing self-tests is determined based on the received indication that self-test execution has ceased within at least one self-test partition, and on the determined available power budget. In particular, a new optimum clock configuration for the self-test components is determined to increase a clock rate of the, or each, clock signal provided to the self-test components.

Having determined the new optimum clock configuration, the method moves on to 1350 where the determined optimum clock configuration is configured. In some examples, steps 1345 and 1350 may be merged into a single step, for example where the optimum clock configuration is performed using combinational logic etc. In this manner, dynamically modulating at least one of the, or each, clock signal(s) provided to the self-test components during a self-test execution phase may be dynamically modulated to increase the clock rate thereof upon receipt of an indication that self-testing has ceased within a self-test component. Having configured the new optimum clock configuration, the method loops back to 1335, upon receipt of at least one further indication that self-testing has ceased within at least one further self-test partition.

Referring back to 1340, if it is determined that the self-test partition for which self-testing has been indicated as having ceased is the last self-test partition within which self-tests were being executed, the method ends at 1355.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit, IC, device comprising a plurality of self-test components arranged to execute self-tests in parallel during a self-test execution phase of the IC device, and at least one clock control component arranged to provide at least one clock signal to the plurality of self-test components at least during the self-test execution phase of the IC device; wherein the at least one clock control component is further arranged to:
receive at least one indication that self-testing has ceased within at least a first self-test component; and
dynamically modulate the at least one clock signal provided to at least one further self-test component for which self-testing has not ceased to increase a clock rate of the at least one clock signal upon receipt of an indication that self-testing has ceased within the at least first self-test component.

2. The IC device of claim 1, wherein the at least one clock control component is arranged to increase the clock rate of the at least one clock signal provided to the self-test components by a constant factor each time an indication that self-testing has ceased within one of the plurality of self-test components is received.

3. The IC device of claim 1, wherein the at least one clock control component is arranged to:
determine a number, i, of active self-test components executing self-tests based at least partly on the at least one received indication that self-testing has ceased within at least one of the plurality of self-test components; and
dynamically modulate the at least one clock signal based at least partly on the determined number i of active self-test components.

4. The IC device of claim 3, wherein the at least one clock control component is arranged to:
receive at least one seed clock signal; and
modulate the at least one seed clock signal to generate the at least one clock signal provided to the self-test components based at least partly on the determined number i of active self-test components.

5. The IC device of claim 3, wherein the at least one clock control component is arranged to:
receive a plurality of seed clock signals; and
generate the at least one clock signal provided to the self-test components based at least partly on one of the received seed clock signals selected in accordance with the determined number i of active self-test components.

6. The IC device of claim 3, wherein the at least one clock control component is arranged to:
receive a plurality of modulation factor values; and
generate the at least one clock signal provided to the self-test components based at least partly on at least one of the received modulation factor values selected in accordance with the determined number i of active self-test components.

7. The IC device of claim 6, wherein the at least one clock control component is arranged to receive at least one seed clock signal and to modulate the at least one seed clock signal in accordance with at least one of the received modulation factor values selected in accordance with the determined number i of active self-test components.

8. The IC device of claim 1, wherein the at least one clock control component is arranged to identify at least one of:
active self-test components executing self-tests; and
inactive self-test components for which self-testing has ceased,
based at least partly on the at least one received indication that self-testing has ceased within at least one of the plurality of self-test components; and
dynamically modulate the at least one clock signal based at least partly on the identified active/inactive self-test components.

9. The IC device of claim 8, wherein the at least one clock control component is arranged to:
receive a plurality of modulation factor values; and
generate the at least one clock signal provided to the self-test components based at least partly on at least one of the received modulation factor values selected in accordance with the identified active/inactive self-test components.

10. A method of performing self-testing within an integrated circuit, IC, device comprising a plurality of self-test components arranged to execute self-tests in parallel during a self-test execution phase of the IC device; the method comprising, within the IC device during a self-test execution phase:
receiving at least one indication that self-testing has ceased within at least a first self-test component of the IC device; and
dynamically modulating at least one clock signal provided to at least one further self-test component of the IC device for which self-testing has not ceased to increase a clock rate of the at least one clock signal upon receipt of the at least one indication that self-testing has ceased within the at least first self-test component of the IC device.

* * * * *